US011542597B2

(12) United States Patent
Wong et al.

(10) Patent No.: US 11,542,597 B2
(45) Date of Patent: Jan. 3, 2023

(54) SELECTIVE DEPOSITION OF METAL OXIDE BY PULSED CHEMICAL VAPOR DEPOSITION

(71) Applicants: Applied Materials, Inc., Santa Clara, CA (US); The Regents of the University of California, Oakland, CA (US)

(72) Inventors: Keith Tatseun Wong, Los Gatos, CA (US); Srinivas D. Nemani, Sunnyvale, CA (US); Andrew C. Kummel, San Diego, CA (US); James Huang, La Jolla, CA (US); Yunil Cho, La Jolla, CA (US)

(73) Assignees: APPLIED MATERIALS, INC., Santa Clara, CA (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 223 days.

(21) Appl. No.: 16/902,665

(22) Filed: Jun. 16, 2020

(65) Prior Publication Data
US 2021/0317573 A1 Oct. 14, 2021

Related U.S. Application Data

(60) Provisional application No. 63/007,124, filed on Apr. 8, 2020.

(51) Int. Cl.
*C23C 16/455* (2006.01)
*C23C 16/40* (2006.01)
*C23C 28/04* (2006.01)

(52) U.S. Cl.
CPC ...... *C23C 16/405* (2013.01); *C23C 16/45523* (2013.01); *C23C 28/04* (2013.01)

(58) Field of Classification Search
None
See application file for complete search history.

(56) References Cited

U.S. PATENT DOCUMENTS 6,596,643 B2  7/2003  Chen et al.
6,620,670 B2  9/2003  Song et al.
(Continued)

FOREIGN PATENT DOCUMENTS

EP       2128876 A1      12/2009
KR    20150119816 A      10/2015

OTHER PUBLICATIONS

Hofman "The pyrolytic decomposition of metal alkoxides during chemical vapor deposition of the thin oxide films", Thermochimica Acta, 215 (1993) 329-335, Elsevier Science Publishers BV Amsterdam (Year: 1993).*

(Continued)

*Primary Examiner* — Mandy C Louie
(74) *Attorney, Agent, or Firm* — Patterson + Sheridan, LLP

(57) ABSTRACT

Embodiments described and discussed herein provide methods for selectively depositing a metal oxides on a substrate. In one or more embodiments, methods for forming a metal oxide material includes positioning a substrate within a processing chamber, where the substrate has passivated and non-passivated surfaces, exposing the substrate to a first metal alkoxide precursor to selectively deposit a first metal oxide layer on or over the non-passivated surface, and exposing the substrate to a second metal alkoxide precursor to selectively deposit a second metal oxide layer on the first metal oxide layer. The method also includes sequentially repeating exposing the substrate to the first and second metal alkoxide precursors to produce a laminate film containing alternating layers of the first and second metal oxide layers. Each of the first and second metal alkoxide precursors (Continued)

contain different types of metals which are selected from titanium, zirconium, hafnium, aluminum, or lanthanum.

20 Claims, 2 Drawing Sheets

(56) References Cited

U.S. PATENT DOCUMENTS

| | | | |
|---|---|---|---|
| 6,720,027 B2 | 4/2004 | Yang et al. |
| 6,838,125 B2 | 1/2005 | Chung et al. |
| 6,846,516 B2 | 1/2005 | Yang et al. |
| 6,858,547 B2 | 2/2005 | Metzner et al. |
| 6,911,391 B2 | 6/2005 | Yang et al. |
| 6,958,296 B2 | 10/2005 | Chen et al. |
| 7,067,439 B2 | 6/2006 | Metzner et al. |
| 7,145,174 B2 | 12/2006 | Chiang et al. |
| 7,242,039 B2 | 7/2007 | Hoffman et al. |
| 7,297,977 B2 | 11/2007 | Hoffman et al. |
| 7,304,004 B2 | 12/2007 | Metzner et al. |
| 7,396,565 B2 | 7/2008 | Yang et al. |
| 7,402,534 B2 | 7/2008 | Mahajani |
| 7,531,468 B2 | 5/2009 | Metzner et al. |
| 7,547,952 B2 | 6/2009 | Metzner et al. |
| 7,659,158 B2 | 2/2010 | Ma et al. |
| 7,776,395 B2 | 8/2010 | Mahajani |
| 7,816,200 B2 | 10/2010 | Kher |
| 7,824,743 B2 | 11/2010 | Lee et al. |
| 7,910,446 B2 | 3/2011 | Ma et al. |
| 7,972,978 B2 | 7/2011 | Mahajani |
| 8,043,907 B2 | 10/2011 | Ma et al. |
| 9,306,078 B2 | 4/2016 | Shieh et al. |
| 9,768,013 B2 | 9/2017 | Dube et al. |
| 9,881,865 B1 * | 1/2018 | Kim ................ H01L 21/76816 |
| 10,047,435 B2 | 8/2018 | Haukka et al. |
| 10,199,215 B2 | 2/2019 | Dube et al. |
| 10,443,123 B2 | 10/2019 | Haukka et al. |
| 11,145,506 B2 | 10/2021 | Maes et al. |
| 2003/0049931 A1 | 3/2003 | Byun et al. |
| 2003/0147820 A1 | 8/2003 | Bertaux et al. |
| 2003/0161204 A1 | 8/2003 | Dhbayashi et al. |
| 2003/0198754 A1 | 10/2003 | Xi et al. |
| 2003/0228413 A1 | 12/2003 | Ohta et al. |
| 2003/0232501 A1 | 12/2003 | Kher et al. |
| 2003/0235961 A1 | 12/2003 | Metzner et al. |
| 2004/0009679 A1 * | 1/2004 | Yeo ................ H01L 21/02181 |
| | | | 438/785 |
| 2004/0154704 A1 | 8/2004 | Schultz et al. |
| 2004/0198069 A1 | 10/2004 | Metzner et al. |
| 2005/0260347 A1 | 11/2005 | Narwankar et al. |
| 2005/0260357 A1 | 11/2005 | Olsen et al. |
| 2005/0271813 A1 | 12/2005 | Kher et al. |
| 2006/0017383 A1 | 1/2006 | Ishida et al. |
| 2006/0019033 A1 | 1/2006 | Muthukrishnan et al. |
| 2006/0062917 A1 | 3/2006 | Muthukrishnan et al. |
| 2006/0134433 A1 | 6/2006 | Maula et al. |
| 2006/0153995 A1 | 7/2006 | Narwankar et al. |
| 2006/0264067 A1 | 11/2006 | Kher et al. |
| 2007/0034870 A1 | 2/2007 | Yamazaki et al. |
| 2007/0065578 A1 | 3/2007 | McDougall |
| 2008/0268154 A1 | 10/2008 | Kher et al. |
| 2008/0299771 A1 | 12/2008 | Irving et al. |
| 2010/0059742 A1 * | 3/2010 | Shieh ................ H01L 21/02592 |
| | | | 257/E29.101 |
| 2010/0075176 A1 | 3/2010 | Yamada et al. |
| 2010/0239758 A1 | 9/2010 | Kher et al. |
| 2015/0299848 A1 | 10/2015 | Haukka et al. |
| 2016/0118243 A1 * | 4/2016 | Tsai ................ H01L 21/02186 |
| | | | 438/104 |
| 2017/0084449 A1 | 3/2017 | Dube et al. |
| 2017/0133292 A1 * | 5/2017 | Baker ................ H05K 3/284 |
| 2017/0352531 A1 | 12/2017 | Dube et al. |
| 2018/0233350 A1 * | 8/2018 | Tois ................ H01L 23/5226 |
| 2018/0350587 A1 * | 12/2018 | Jia ................ H01L 21/02205 |
| 2019/0057858 A1 | 2/2019 | Hausmann et al. |
| 2019/0100837 A1 | 4/2019 | Haukka et al. |
| 2019/0148131 A1 | 5/2019 | Dube et al. |
| 2019/0155159 A1 | 5/2019 | Knaepen et al. |
| 2019/0283077 A1 | 9/2019 | Pore et al. |
| 2019/0333761 A1 | 10/2019 | Tois et al. |
| 2019/0341245 A1 | 11/2019 | Tois et al. |
| 2020/0051829 A1 | 2/2020 | Tois et al. |
| 2020/0105515 A1 * | 4/2020 | Maes ................ H01L 21/02669 |
| 2020/0181766 A1 | 6/2020 | Haukka et al. |
| 2021/0301394 A1 * | 9/2021 | Illiberi ................ H01L 21/0228 |
| 2021/0358745 A1 | 11/2021 | Maes et al. |
| 2022/0208542 A1 | 6/2022 | Maes et al. |

OTHER PUBLICATIONS

Testoni et al., "Influence of the Al2O3 partial-monolayer number on the crystallization mechanism of TiO2 in ALD TiO2/Al2O3 nanolaminates and its impact on the material properties"; J. Phys. D: Appl. Phys. 49 (2016) 375301 (14pp).

Atanasov et al., "Inherent substrate-dependent growth initiation and selective-area atomic layer deposition of TiO2 using "water-free" metal-halide/metal alkoxide reactants"; J. Vac. Sci. Technol. A 34, 01A148 (2016) 10pp.

Triyoso et al., "Impact of titanium addition on film characteristics of HfO2 gate dielectrics deposited by atomic layer deposition"; J. Appl. Phys. 98, 054104 (2005) 9 pp.

Choi et al., "Selective pulsed chemical vapor deposition of water-free HfOx on Si in preference to SiCOH and passivated SiO2"; Applied Surface Science 512 (2020) 145733 (10 pp).

International Search Report and Written Opinion dated May 26, 2021 for Application No. PCT/US2021/016257.

* cited by examiner

SELECTIVE DEPOSITION OF METAL OXIDE BY PULSED CHEMICAL VAPOR DEPOSITION

CROSS-REFERENCE TO RELATED APPLICATIONS

This application claims benefit to U.S. Appl. No. 63/007,124, filed on Apr. 8, 2020, which is herein incorporated by reference.

BACKGROUND

Field

Embodiments of the present disclosure generally relate to deposition processes, and in particular to vapor deposition processes for metal oxides.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As the geometry limits of the structures used to form semiconductor devices are pushed against technology limits, the need for accurate formation with desired materials for the manufacture of structures having small critical dimensions and high aspect ratios and structures with certain desired materials has become increasingly difficult to satisfy. The conventional selective deposition process often cannot efficiently be confined to designated small areas of the substrate, resulting in undesired materials being formed on undesired locations of the substrate. Thus, deposited materials are generally globally formed across the entire surface of the substrate without selectivity or be deposited on undesired locations of the substrate, thus making the selective deposition processes difficult to achieve and often resulting in cross contamination on the substrate surface.

Therefore, there is a need for improved methods for selectively depositing metal oxides.

SUMMARY

Embodiments described and discussed herein provide methods for depositing a metal oxide material, such a laminate film containing alternating layers of two or more types of metal oxide layers. The metal oxide material is amorphous since the alloying of the two or more types of metal oxides prevents crystallization of the overall material.

In one or more embodiments, a method of forming a metal oxide material includes positioning a substrate within a processing chamber, where the substrate has one or more passivated surfaces and one or more non-passivated surfaces, exposing the substrate to a first metal alkoxide precursor to produce a first metal oxide layer on or over the non-passivated surface while the passivated surface remains at least substantially free of the first metal oxide layer. The first metal alkoxide precursor is thermally decomposed to produce the first metal oxide layer. The method also includes exposing the substrate to a second metal alkoxide precursor to produce a second metal oxide layer on the first metal oxide layer while the passivated surface remains at least substantially free of the second metal oxide layer. The second metal alkoxide precursor is thermally decomposed to produce the second metal oxide layer. The method further includes sequentially repeating exposing the substrate to the first metal alkoxide precursor and the second metal alkoxide precursor to produce a laminate film containing alternating layers of the first and second metal oxide layers. Each of the first metal alkoxide precursor and the second metal alkoxide precursor have different metals which are selected from titanium, zirconium, hafnium, aluminum, or lanthanum.

In other embodiments, a method of forming a metal oxide material includes positioning a substrate within a processing chamber, where the substrate has one or more passivated surfaces and one or more non-passivated surfaces and depositing or otherwise forming a laminate film selectively on the non-passivated surface while the passivated surface remains at least substantially free of the laminate film. The laminate film contains two or more pairs of alternating layers of a first metal oxide layer and a second metal oxide layer. A first metal alkoxide precursor is thermally decomposed to produce the first metal oxide layer during a first pulsed-chemical vapor deposition process. Similarly, a second metal alkoxide precursor is thermally decomposed to produce the second metal oxide layer during a second pulsed-chemical vapor deposition process.

In some embodiments, a method of forming a metal oxide material includes positioning a substrate within a processing chamber, where the substrate has one or more passivated surfaces and one or more non-passivated surfaces, and exposing the substrate to a first metal alkoxide precursor to produce a first metal oxide layer on or over the non-passivated surface while the passivated surface remains at least substantially free of the first metal oxide layer, where the first metal alkoxide precursor is thermally decomposed to produce the first metal oxide layer while the substrate is maintained at a first temperature of about 150° C. to about 350° C. The method also includes exposing the substrate to a second metal alkoxide precursor to produce a second metal oxide layer on the first metal oxide layer while the passivated surface remains at least substantially free of the second metal oxide layer, where the second metal alkoxide precursor is thermally decomposed to produce the second metal oxide layer while the substrate is maintained at a second temperature of about 150° C. to about 350° C. Each of the first metal oxide layer and the second metal oxide layer have different metal oxides which are selected from titanium oxide, zirconium oxide, hafnium oxide, aluminum oxide, dopants thereof, or lanthanum oxide. The method also includes sequentially repeating exposing the substrate to the first metal alkoxide precursor and the second metal alkoxide precursor to produce a laminate film containing alternating layers of the first and second metal oxide layers, wherein the laminate film is amorphous, and where the laminate film contains about 10 pairs to about 100 pairs of the first and second metal oxide layers.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the Figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

In one or more embodiments, a method for forming a metal oxide material, such as selectively depositing a laminate film of metal oxides, is provided. Two or more metal alkoxide precursors are used during pulsed-chemical vapor deposition (CVD) processes to form the laminate film on a substrate. The laminate film contains alternating layers of two different metal oxides with different types of metals, such as a first metal oxide layer and a second metal oxide layer. Each of the metal oxide layers can independently be or include titanium oxide, zirconium oxide, hafnium oxide, aluminum oxide, lanthanum oxide, dopants thereof, or any combination thereof. It is believed that the alloying of the two or more different metal oxide layers prevents crystallization, and as such, provides the metal oxide material to be non-crystalline or amorphous.

Figure 1:
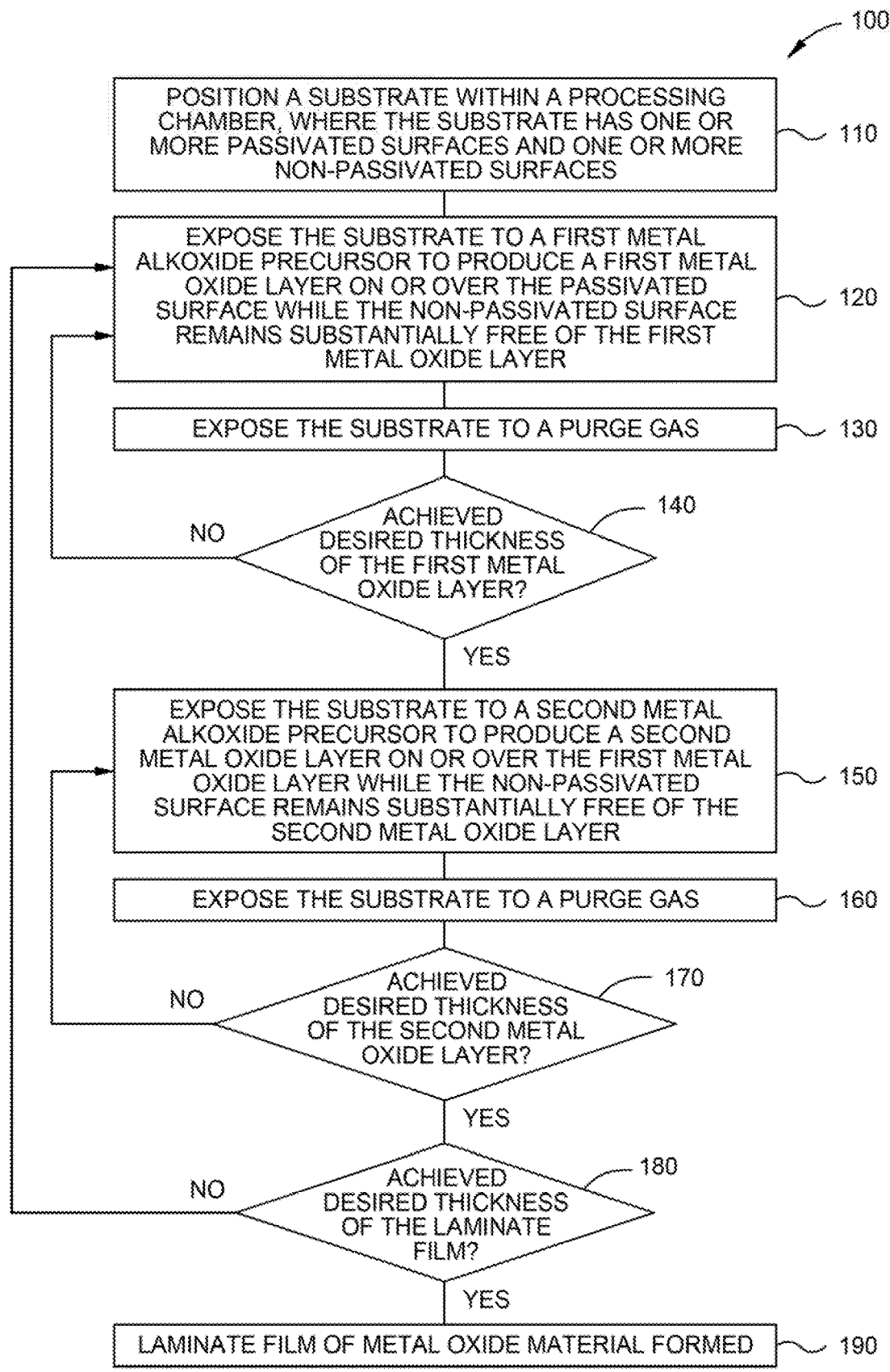
FIG. 1 is a flow chart of a process for producing a laminate film containing a metal oxide material on a substrate, according to one or more embodiments described and discussed herein.
Figure 2:
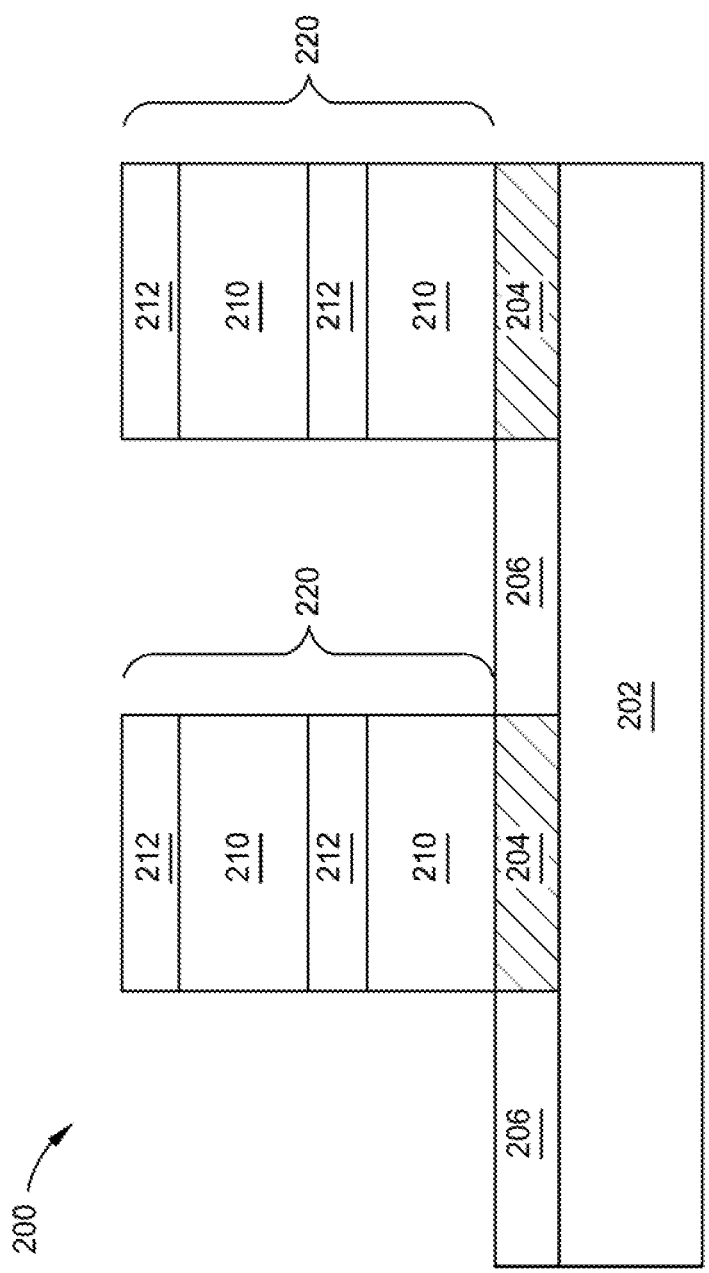
FIG. 2 depicts a cross-sectional view of a laminate film, according to one or more embodiments described and discussed herein.

FIG. 1 is a flow chart of a process 100 which can be used to selectively deposit laminate films containing metal oxide materials on a substrate or other surface. FIG. 2 depicts a cross-sectional view of a workpiece 200 containing a laminate film 220 disposed on a substrate 202. The laminate film 220 is one example of different types of laminate films which can be produced by the process 100. The laminate film 220 and similar structures and devices can be or include a back-end structure or device, front-end structure or device, interconnection structure or device, passivation structure or device, a fin structure, a gate structure or device, a contact structure, or any suitable structure or device used in microelectronics, such as semiconductor devices, display devices, photovoltaic devices, battery or energy storage devices, and other devices.

The process 100 includes operations 110-190, as shown in FIG. 1. At operation 110, one or more substrates can be placed or otherwise positioned within a processing chamber. The processing chamber can be or include a CVD chamber, a pulsed-CVD chamber, a plasma-enhanced CVD (PE-CVD) chamber, an atomic layer deposition (ALD) chamber, a plasma-enhanced ALD (PE-ALD) chamber, a thermal anneal chamber, as well as other types of chambers. In one or more examples, the process 100 is performed in a thermal, pulsed-CVD chamber or a thermal, ALD chamber, such as the Trillium® chamber, commercially available from Applied Materials, Inc.

The substrate 202 contains one or more non-passivated materials or surfaces 204 and one or more passivated materials or surfaces 206. The metal oxide materials of the laminate film 220 are selectively deposited on one type of surface over another type surface. More specifically, the laminate film 220 is selectively deposited or otherwise formed on the non-passivated surface 204 while the passivated surface 206 remains completely free or substantially free of the metal oxide material forming the laminate film 220.

The non-passivated surfaces 204 can be a hydrogen-terminated surface (—H) and/or a hydroxyl-terminated surface (—OH) of a silicon substrate or a silicon-containing material, a silicon oxide substrate or a silicon oxide containing material, a metal (e.g., copper, tungsten, cobalt, aluminum, alloys thereof) or contact material, or variations thereof. In one or more examples, the non-passivated surface 204 is a hydrogen-terminated silicon surface where the underlying layer is a silicon substrate or a silicon-containing material. In other examples, the non-passivated surface 204 is a hydroxyl-terminated silicon oxide surface where the underlying layer is a silicon oxide substrate or a silicon oxide containing material.

The passivated surfaces 206 can be an alkyl-terminated surface and can be terminated with one or more alkyl groups, such as such as a methyl group (—$CH_3$), an ethyl group (—$CH_2CH_3$), a propyl group (—$CH_2CH_2CH_3$), a butyl group (—$CH_2CH_2CH_2CH_3$), other alkyl groups, or any combination thereof. In one or more examples, the passivated surface 206 is a methyl-terminated surface where the underlying layer and/or substrate is or contains a carbon-doped silicon oxide (SiCOH) material, for example, a Black Diamond® material, commercially available from Applied Materials, Inc.

In one or more embodiments, the passivated surface 206 is or contains one or more dielectric materials, such as silicon oxide, doped silicon materials, or low-k materials, such as carbon containing materials. Suitable carbon containing materials can be or include amorphous carbon, silicon carbide, carbon-doped silicon oxide materials, or combinations thereof. Exemplary low-k insulating dielectric materials can be or include silicon oxide materials, silicon nitride materials, carbon-doped silicon oxide materials, silicon carbide materials, carbon based materials, or any combination thereof.

In one or more examples, the non-passivated surface 204 is terminated with hydride groups, hydroxide groups, or a combination thereof, and the passivated surface 206 is terminated with one or more alkyl groups.

The substrate 202 can be or include materials selected from crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 202 can have various dimensions, such as 200 mm, 300 mm, 450 mm or other diameter, as well as, being a rectangular or square panel. Unless otherwise noted, embodiments and examples described herein are conducted on substrates with a 200 mm diameter, a 300 mm diameter, or a 450 mm diameter substrate. In the embodiment wherein a SOI structure is utilized for the substrate 202, the substrate 202 can include a buried dielectric layer disposed on a silicon crystalline substrate. In the embodiment depicted herein, the substrate 202 can be a crystalline silicon substrate. Moreover, the substrate 202 is not limited to any particular size or shape. The substrate 202 can be a circular, polygonal, square, rectangular, curved or otherwise non-circular workpiece, such as a polygonal glass substrate used in the fabrication of flat panel displays.

At operation 120, the workpiece 200 and/or the substrate 202 is exposed to a first metal alkoxide precursor to produce a first metal oxide layer 210 on or over the non-passivated surface 204 while the passivated surface 206 remains at least substantially free if not completely free of the first metal oxide layer 210. The metal of the first metal alkoxide precursor is selected from titanium, zirconium, hafnium, aluminum, or lanthanum, such that the deposited metal oxide contained in the first metal oxide layer 210 is selected from titanium oxide, zirconium oxide, hafnium oxide, aluminum oxide, lanthanum oxide, or dopants thereof.

At operation 130, the workpiece 200 and/or the substrate 202 containing the first metal oxide layer 210 is exposed to a first purge gas. The first purge gas removes byproducts, excess precursor, and other undesired agents or contaminants. The first purge gas can be or include nitrogen ($N_2$), argon, helium, or any combination thereof. The purge gas can have a flow rate of about 500 sccm to about 4,000 sccm, such as about 500 sccm to about 1,000 sccm.

At operations 120 and 130, the first metal alkoxide precursor is thermally decomposed to produce the first metal oxide layer 210 during the first pulsed-CVD process. The substrate 202 is heated and/or maintained at a temperature of about 150° C. to about 450° C., such as about 200° C. to about 350° C., about 150° C. to about 350° C., or about 250° C. to about 300° C. during operations 120 and 130. The interior volume or process region of the CVD or other processing chamber can be maintained at a pressure of about 10 mTorr to about 10 Torr, such as about 100 mTorr to about 500 mTorr during the first pulsed-CVD process.

The cycle of exposing the workpiece 200 and/or the substrate 202 to the first metal alkoxide precursor and the first purge gas can be performed one time or multiple times, such as 2, 3, 5, about 10, about 15, about 20, about 25, about 30, about 40, about 50, about 65, about 80, about 100 times, or more. The workpiece 200 and/or the substrate 202 is sequentially exposed to the first metal alkoxide precursor and the first purge gas during the first pulsed-CVD process.

In one or more examples, the workpiece 200 and/or the substrate 202 is exposed to the first metal alkoxide precursor for a period of about 0.1 seconds to about 10 seconds and then exposed to the first purge gas for a period of about 1 second to about 120 seconds. In other examples, the workpiece 200 and/or the substrate 202 is exposed to the first metal alkoxide precursor for a period of about 0.1 seconds to about 2 seconds and then exposed to the first purge for a period of about 1 second to about 30 seconds.

At operation 140, if the desired thickness of the first metal oxide layer 210 is deposited or otherwise achieved, then the process 100 advances to operation 150. If the desired thickness of the first metal oxide layer 210 is not deposited or otherwise achieved, then operations 120 and 130 are repeated until the desired thickness of the first metal oxide layer 210 is achieved. The first metal oxide layer 210 can have a thickness of about 0.05 nm to about 10 nm, such as about 0.1 nm to about 5 nm or about 0.15 nm to about 1.2 nm.

At operation 150, the workpiece 200 and/or the substrate 202 is exposed to a second metal alkoxide precursor to produce a second metal oxide layer 212 on the first metal oxide layer 210 while the passivated surface 206 remains at least substantially free if not completely free of the second metal oxide layer 212. The metal of the second metal alkoxide precursor is selected from titanium, zirconium, hafnium, aluminum, or lanthanum, such that the deposited metal oxide contained in the second metal oxide layer 212 has a different metal than the metal selected for the first metal oxide layer 210. As such, the second metal oxide layer 212 contains titanium oxide, zirconium oxide, hafnium oxide, aluminum oxide, lanthanum oxide, or dopants thereof. As such, since the metal in the first metal oxide layer 210 is different than the metal in the second metal oxide layer 212, the laminate film 220 is maintained amorphous or non-crystalline.

In operations 120 and 150, at least the first metal alkoxide precursor and/or the second metal alkoxide precursor is thermally decomposed by β-hydride elimination process. The first metal alkoxide precursor and the second metal alkoxide precursor are thermally decomposed to produce the first and second metal oxide layers, respectively, in the absence of a co-reactant. In typical CVD or ALD processes, an oxidizing agent is used with a metal precursor to form a metal oxide. However, the deposition processes described and discussed herein rely on thermal decomposition and usually β-hydride elimination to produce the metal oxides. The metal oxide precursor is both the metal source and the oxygen source. As such, the thermal decomposition of the metal alkoxide precursor is a single source of both the metal and the oxygen for the metal oxide layer. In one or more examples, there is not a co-reactant, such as an oxidizing agent, which is independent of the metal alkoxide precursor during the pulsed-CVD process. In other examples, one or more oxidizing agents (e.g., water, oxygen ($O_2$), ozone, hydrogen peroxide, an alcohol) can be used along with the metal alkoxide precursor to produce the metal oxide layer during the pulsed-CVD process.

In one or more embodiments, each of the first metal alkoxide precursor and the second metal alkoxide precursor independently is or contains one or more metal propoxide compounds (e.g., metal iso-propoxide compounds) and/or one or more metal butoxide compounds (e.g., metal tert-butoxide compounds). As discussed above, the metal of the first metal alkoxide precursor is different than the metal of the second metal alkoxide precursor. In one or more examples, each of the first metal alkoxide precursor and the second metal alkoxide precursor independently is or contains titanium (IV) n-propoxide, titanium (IV) iso-propoxide, titanium (IV) n-butoxide, titanium (IV) tert-butoxide, hafnium (IV) n-propoxide, hafnium (IV) iso-propoxide, hafnium (IV) n-butoxide, hafnium (IV) tert-butoxide, zirconium (IV) n-propoxide, zirconium (IV) iso-propoxide, zirconium (IV) n-butoxide, zirconium (IV) tert-butoxide, aluminum (III) n-propoxide, aluminum (III) iso-propoxide, aluminum (III) n-butoxide, aluminum (III) tert-butoxide, lanthanum (III) n-propoxide, lanthanum (III) iso-propoxide, lanthanum (III) n-butoxide, lanthanum (III) tert-butoxide, isomers thereof, or any combination thereof. Other types of metal alkoxide precursors can be used in the processes described and discussed herein.

At operation 160, the workpiece 200 and/or the substrate 202 containing the second metal oxide layer 212 is exposed to a second purge gas. The second purge gas removes byproducts, excess precursor, and other undesired agents or contaminants. The second purge gas can be or include nitrogen ($N_2$), argon, helium, or any combination thereof. The purge gas can have a flow rate of about 500 sccm to about 4,000 sccm, such as about 500 sccm to about 1,000 sccm.

At operations 150 and 160, the second metal alkoxide precursor is thermally decomposed to produce the second metal oxide layer 212 during the second pulsed-CVD process. The substrate 202 is heated and/or maintained at a temperature of about 150° C. to about 450° C., such as about 200° C. to about 350° C., about 150° C. to about 350° C., or about 250° C. to about 300° C. during operations 150 and 160. The interior volume or process region of the CVD or other processing chamber can be maintained at a pressure of about 10 mTorr to about 10 Torr, such as about 100 mTorr to about 500 mTorr during the second pulsed-CVD process.

The cycle of exposing the workpiece 200 and/or the substrate 202 to the second metal alkoxide precursor and the second purge gas can be performed one time or multiple times, such as 2, 3, 5, about 10, about 15, about 20, about 25, about 30, about 40, about 50, about 65, about 80, about 100 times, or more. The workpiece 200 and/or the substrate 202 is sequentially exposed to the second metal alkoxide precursor and the second purge gas during the second pulsed-CVD process.

In one or more examples, the workpiece 200 and/or the substrate 202 is exposed to the second metal alkoxide precursor for a period of about 0.1 seconds to about 10 seconds and then exposed to the second purge gas for a period of about 1 second to about 150 seconds. In other examples, the workpiece 200 and/or the substrate 202 is exposed to the second metal alkoxide precursor for a period of about 0.1 seconds to about 2 seconds and then exposed to the second purge for a period of about 1 second to about 30 seconds.

At operation 170, if the desired thickness of the second metal oxide layer 212 is deposited or otherwise achieved, then the process 100 advances to operation 180. If the desired thickness of the second metal oxide layer 212 is not deposited or otherwise achieved, then operations 150 and 160 are repeated until the desired thickness of the second metal oxide layer 212 is achieved. The second metal oxide layer 212 can have a thickness of about 0.05 nm to about 10 nm, such as about 0.1 nm to about 5 nm or about 0.15 nm to about 1.2 nm.

At operation 180, if the desired thickness of the laminate film 220 is deposited, formed, or otherwise achieved, then the process 100 advances to operation 190 in which the process 100 is complete. If the desired thickness of the laminate film 220 is not deposited, formed, or otherwise achieved, then operations 120-170 are repeated until the desired thickness of the laminate film 220 is achieved. For example, the process 100 includes sequentially repeating exposing the workpiece 200 and/or the substrate 202 to the first metal alkoxide precursor and the first purge gas in operations 120 and 130 and the second metal alkoxide precursor and the second purge gas in operations 150 and 160 to produce a laminate film 220 containing alternating layers of the first and second metal oxide layers 210, 212. When operation 120 is repeated after operation 180, the first metal oxide layer 210 is deposited on the second metal oxide layer 212 instead of the non-passivated surface 204.

Operations 120-170 are repeated until the laminate film 220 has a thickness of about 2 nm to about 100 nm, about 5 nm to about 50 nm, about 10 nm to about 35 nm, or about 15 nm to about 25 nm. Alternatively, operations 120-170 are repeated until the desired number of pairs of the first and second metal oxide layers 210, 212 is achieved. The laminate film 220 contains about 2 pairs, about 5 pairs, about 10 pairs, about 20 pairs, or about 30 pairs to about 40 pairs, about 50 pairs, about 80 pairs, about 100 pairs, about 150 pairs, about 200 pairs or more pairs of the first and second metal oxide layers 210, 212. In some examples, the laminate film 220 contains about 10 pairs to about 100 pairs of the first and second metal oxide layers 210, 212. In other examples, the laminate film 220 contains about 10 pairs to about 50 pairs or about 20 pairs to about 40 pairs of the first and second metal oxide layers 210, 212.

In one or more embodiments, the first metal oxide layer 210 contains a first metal and the second metal oxide layer 212 contains a second metal, which is different than the first metal. The laminate film 220 has an atomic ratio of the first metal to the second metal of about 5:1 to about 15:1, about 6:1 to about 12:1, or about 7:1 to about 10:1. In one or more examples of the laminate film 220, the first metal oxide layer 210 contains titanium oxide and the second metal oxide layer 212 contains hafnium oxide. The atomic ratio of titanium to hafnium is about 5:1 to about 15:1, about 6:1 to about 12:1, or about 7:1 to about 10:1 for the laminate film 220.

In one or more examples, the first metal oxide layer 210 containing titanium oxide has a thickness of about 0.5 nm to about 2 nm and the second metal oxide layer 212 containing hafnium oxide has a thickness of about 0.08 nm to about 0.5 nm. In some examples, the first metal oxide layer 210 containing titanium oxide has a thickness of about 0.8 nm to about 1.5 nm and the second metal oxide layer 212 containing hafnium oxide has a thickness of about 0.1 nm to about 0.3 nm. In other examples, the first metal oxide layer 210 containing titanium oxide has a thickness of about 1 nm to about 1.2 nm, such as 1.14 nm and the second metal oxide layer 212 containing hafnium oxide has a thickness of about 0.12 nm to about 0.2 nm, such as 0.16 nm.

Thus, a selective deposition process is provided to form a metal oxide materials on different surfaces, e.g., different portions, of a substrate by a selective CVD process. Thus, a structure with desired different type of materials formed on different locations of the substrate may be obtained.

Embodiments of the present disclosure further relate to any one or more of the following paragraphs 1-33:

1. A method of forming a metal oxide material, comprising: positioning a substrate within a processing chamber, wherein the substrate comprises a passivated surface and a non-passivated surface; exposing the substrate to a first metal alkoxide precursor to produce a first metal oxide layer on or over the non-passivated surface while the passivated surface remains at least substantially free of the first metal oxide layer, wherein the first metal alkoxide precursor is thermally decomposed to produce the first metal oxide layer; exposing the substrate to a second metal alkoxide precursor to produce a second metal oxide layer on the first metal oxide layer while the passivated surface remains at least substantially free of the second metal oxide layer, wherein the second metal alkoxide precursor is thermally decomposed to produce the second metal oxide layer; and sequentially repeating exposing the substrate to the first metal alkoxide precursor and the second metal alkoxide precursor to produce a laminate film comprising alternating layers of the first and second metal oxide layers, wherein the first metal alkoxide precursor and the second metal alkoxide precursor independently comprises a metal selected from the group consisting of titanium, zirconium, hafnium, aluminum, and lanthanum, and wherein the first metal alkoxide precursor and the second metal alkoxide precursor have different metals.

2. A method of forming a metal oxide material, comprising: positioning a substrate within a processing chamber, wherein the substrate comprises a passivated surface and a non-passivated surface; and depositing a laminate film selectively on the non-passivated surface while the passivated surface remains at least substantially free of the laminate film, wherein: the laminate film comprises two or more pairs of alternating layers of a first metal oxide layer and a second metal oxide layer, a first metal alkoxide precursor is thermally decomposed to produce the first metal oxide layer during a first pulsed-chemical vapor deposition process, a second metal alkoxide precursor is thermally decomposed to produce the second metal oxide layer during a second pulsed-chemical vapor deposition process, the first metal alkoxide precursor and the second metal alkoxide precursor independently comprises a metal selected from the group consisting of titanium, zirconium, hafnium, aluminum, and lanthanum, and the first metal alkoxide precursor and the second metal alkoxide precursor have different metals.

3. A method of forming a metal oxide material, comprising: positioning a substrate within a processing chamber, wherein the substrate comprises a passivated surface and a non-passivated surface; exposing the substrate to a first metal alkoxide precursor to produce a first metal oxide layer on or over the non-passivated surface while the passivated surface remains at least substantially free of the first metal oxide layer, wherein the first metal alkoxide precursor is thermally decomposed to produce the first metal oxide layer while the substrate is maintained at a first temperature of about 150° C. to about 350° C.; exposing the substrate to a second metal alkoxide precursor to produce a second metal oxide layer on the first metal oxide layer while the passivated surface remains at least substantially free of the second metal oxide layer, wherein the second metal alkoxide precursor is thermally decomposed to produce the second metal oxide layer while the substrate is maintained at a second temperature of about 150° C. to about 350° C.; and sequentially repeating exposing the substrate to the first metal alkoxide precursor and the second metal alkoxide precursor to produce a laminate film comprising alternating layers of the first and second metal oxide layers, wherein the laminate film is amorphous, and wherein the laminate film comprises about 10 pairs to about 100 pairs of the first and second metal oxide layers, wherein the first metal oxide layer and the second metal oxide layer independently comprises a metal oxide selected from the group consisting of titanium oxide, zirconium oxide, hafnium oxide, aluminum oxide, lanthanum oxide, and dopants thereof, and wherein the first metal oxide layer and the second metal oxide layer contain different metal oxides.

4. The method according to any one of paragraphs 1-3, wherein the substrate is maintained at a first temperature during the first pulsed-chemical vapor deposition process and at a second temperature during the second pulsed-chemical vapor deposition process, and wherein each of the first temperature and the second temperature is independently at about 150° C. to about 450° C.

5. The method according to any one of paragraphs 1-4, wherein each of the first temperature and the second temperature is independently at about 200° C. to about 350° C.

6. The method according to any one of paragraphs 1-5, wherein each of the first metal oxide layer and the second metal oxide layer independently has a thickness of about 0.1 nm to about 5 nm, and wherein the laminate film comprises about 10 pairs to about 50 pairs of the first and second metal oxide layers.

7. The method according to any one of paragraphs 1-6, wherein the substrate is maintained at a temperature of about 150° C. to about 450° C. when producing the first metal oxide layer and/or the second metal oxide layer.

8. The method according to any one of paragraphs 1-7, wherein the substrate is maintained at a temperature of about 200° C. to about 350° C.

9. The method according to any one of paragraphs 1-8, wherein the substrate is maintained at a temperature of about 250° C. to about 300° C.

10. The method according to any one of paragraphs 1-9, wherein the laminate film is amorphous.

11. The method according to any one of paragraphs 1-10, wherein each of the first metal oxide layer and the second metal oxide layer independently has a thickness of about 0.1 nm to about 5 nm.

12. The method according to any one of paragraphs 1-11, wherein each of the first metal oxide layer and the second metal oxide layer independently has a thickness of about 0.15 nm to about 1.2 nm.

13. The method according to any one of paragraphs 1-12, wherein the laminate film comprises about 10 pairs to about 50 pairs of the first and second metal oxide layers.

14. The method according to any one of paragraphs 1-13, wherein the laminate film comprises about 20 pairs to about 40 pairs.

15. The method according to any one of paragraphs 1-14, wherein the laminate film has a thickness of about 5 nm to about 50 nm.

16. The method according to any one of paragraphs 1-15, wherein the laminate film has a thickness of about 10 nm to about 35 nm.

17. The method according to any one of paragraphs 1-16, wherein the laminate film has a thickness of about 15 nm to about 25 nm.

18. The method according to any one of paragraphs 1-17, wherein the first metal oxide layer is produced during a first pulsed-chemical vapor deposition process, wherein the substrate is sequentially exposed to the first metal alkoxide precursor and a first purge gas during the first pulsed-chemical vapor deposition process, and wherein the substrate is exposed to the first metal alkoxide precursor for a period of about 0.1 seconds to about 10 seconds and exposed to the first purge gas for a period of about 1 second to about 120 seconds.

19. The method according to any one of paragraphs 1-18, wherein the first metal oxide layer is produced during a first pulsed-chemical vapor deposition process, wherein the substrate is sequentially exposed to the first metal alkoxide precursor and a first purge gas during the first pulsed-chemical vapor deposition process, and wherein the substrate is exposed to the first metal alkoxide precursor for a period of about 0.1 seconds to about 2 seconds and exposed to the first purge for a period of about 1 second to about 30 seconds.

20. The method according to any one of paragraphs 1-19, wherein the first purge gas can be or include nitrogen ($N_2$), argon, helium, or combinations thereof.

21. The method according to any one of paragraphs 1-20, wherein the second metal oxide layer is produced during a second pulsed-chemical vapor deposition process, wherein the substrate is sequentially exposed to the second metal alkoxide precursor and a second purge gas during the second pulsed-chemical vapor deposition process, and wherein the substrate is exposed to the second metal alkoxide precursor for a period of about 0.1 seconds to about 10 seconds and exposed to the second purge gas for a period of about 1 second to about 120 seconds.

22. The method according to any one of paragraphs 1-21, wherein the second metal oxide layer is produced during a second pulsed-chemical vapor deposition process, wherein the substrate is sequentially exposed to the second metal alkoxide precursor and a second purge gas during the second pulsed-chemical vapor deposition process, and wherein the substrate is exposed to the second metal alkoxide precursor for a period of about 0.1 seconds to about 2 seconds and exposed to the second purge for a period of about 1 second to about 30 seconds.

23. The method according to any one of paragraphs 1-22, wherein the second purge gas can be or include nitrogen ($N_2$), argon, helium, or combinations thereof.

24. The method according to any one of paragraphs 1-23, wherein the first metal alkoxide precursor and the second metal alkoxide precursor independently comprises a metal propoxide compound or a metal butoxide compound.

25. The method according to any one of paragraphs 1-24, wherein the first metal alkoxide precursor and the second metal alkoxide precursor independently comprises a metal iso-propoxide compound or a metal tert-butoxide compound.

26. The method according to any one of paragraphs 1-25, wherein the first metal alkoxide precursor and the second metal alkoxide precursor independently comprises titanium (IV) n-propoxide, titanium (IV) iso-propoxide, titanium (IV) n-butoxide, titanium (IV) tert-butoxide, hafnium (IV) n-propoxide, hafnium (IV) iso-propoxide, hafnium (IV) n-butoxide, hafnium (IV) tert-butoxide, zirconium (IV) n-propoxide, zirconium (IV) iso-propoxide, zirconium (IV) n-butoxide, zirconium (IV) tert-butoxide, aluminum (III) n-propoxide, aluminum (III) iso-propoxide, aluminum (III) n-butoxide, aluminum (III) tert-butoxide, lanthanum (III) n-propoxide, lanthanum (III) iso-propoxide, lanthanum (III) n-butoxide, lanthanum (III) tert-butoxide, isomers thereof, or any combination thereof.

27. The method according to any one of paragraphs 1-26, wherein the first metal oxide layer comprises titanium oxide and the second metal oxide layer comprises hafnium oxide.

28. The method according to any one of paragraphs 1-27, wherein the first metal oxide layer comprises a first metal and the second metal oxide layer comprises a second metal, and wherein the laminate film has an atomic ratio of the first metal to the second metal of about 5:1 to about 15:1.

29. The method according to any one of paragraphs 1-28, wherein the first metal oxide layer comprises a first metal and the second metal oxide layer comprises a second metal, and wherein the laminate film has an atomic ratio of the first metal to the second metal of about 6:1 to about 12:1.

30. The method according to any one of paragraphs 1-29, wherein the first metal oxide layer comprises a first metal and the second metal oxide layer comprises a second metal, and wherein the laminate film has an atomic ratio of the first metal to the second metal of about 7:1 to about 10:1.

31. The method according to any one of paragraphs 1-30, wherein the non-passivated surface is terminated with hydride groups, hydroxide groups, or a combination thereof, and wherein the passivated surface is terminated with one or more alkyl groups.

32. The method according to any one of paragraphs 1-31, wherein at least the first metal alkoxide precursor or the second metal alkoxide precursor is thermally decomposed by β-hydride elimination process.

33. The method according to any one of paragraphs 1-32, wherein at least the first metal alkoxide precursor or the second metal alkoxide precursor is thermally decomposed to produce the first or second metal oxide layer while in the absence of a co-reactant.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

The invention claimed is:

1. A method of forming a metal oxide material, comprising:
    positioning a substrate within a processing chamber, wherein the substrate comprises a passivated surface and a non-passivated surface, and wherein the non-passivated surface is terminated with hydride groups, hydroxide groups, or a combination thereof;
    exposing the substrate to a first metal alkoxide precursor to produce a first metal oxide layer on or over the non-passivated surface while the passivated surface remains at least substantially free of the first metal oxide layer, wherein the first metal alkoxide precursor is thermally decomposed to produce the first metal oxide layer;
    exposing the substrate to a second metal alkoxide precursor to produce a second metal oxide layer on the first metal oxide layer while the passivated surface remains at least substantially free of the second metal oxide layer, wherein the second metal alkoxide precursor is thermally decomposed to produce the second metal oxide layer; and
    sequentially repeating exposing the substrate to the first metal alkoxide precursor and the second metal alkoxide precursor to produce a laminate film comprising alternating layers of the first and second metal oxide layers,
    wherein the first metal alkoxide precursor and the second metal alkoxide precursor independently comprises a metal selected from the group consisting of titanium, zirconium, hafnium, aluminum, and lanthanum, and
    wherein the first metal alkoxide precursor and the second metal alkoxide precursor have different metals.

2. The method of claim 1, wherein the laminate film is amorphous.

3. The method of claim 1, wherein the substrate is maintained at a temperature of about 150° C. to about 450° C. when producing the first metal oxide layer and/or the second metal oxide layer.

4. The method of claim 1, wherein each of the first metal oxide layer and the second metal oxide layer independently has a thickness of about 0.1 nm to about 5 nm.

5. The method of claim 1, wherein the laminate film comprises about 10 pairs to about 50 pairs of the first and second metal oxide layers.

6. The method of claim 1, wherein the laminate film has a thickness of about 5 nm to about 50 nm.

7. The method of claim 1, wherein the first metal oxide layer is produced during a first pulsed-chemical vapor deposition process, wherein the substrate is sequentially exposed to the first metal alkoxide precursor and a first purge gas during the first pulsed-chemical vapor deposition process, and wherein the substrate is exposed to the first metal alkoxide precursor for a period of about 0.1 seconds to about 10 seconds and exposed to the first purge gas for a period of about 1 second to about 120 seconds.

8. The method of claim 1, wherein the second metal oxide layer is produced during a second pulsed-chemical vapor deposition process, wherein the substrate is sequentially exposed to the second metal alkoxide precursor and a second purge gas during the second pulsed-chemical vapor deposition process, and wherein the substrate is exposed to the second metal alkoxide precursor for a period of about 0.1 seconds to about 10 seconds and exposed to the second purge gas for a period of about 1 second to about 120 seconds.

9. The method of claim 1, wherein the first metal alkoxide precursor and the second metal alkoxide precursor independently comprises a metal propoxide compound or a metal butoxide compound.

10. The method of claim 1, wherein the first metal alkoxide precursor and the second metal alkoxide precursor independently comprises titanium (IV) n-propoxide, titanium (IV) iso-propoxide, titanium (IV) n-butoxide, titanium (IV) tert-butoxide, hafnium (IV) n-propoxide, hafnium (IV) iso-propoxide, hafnium (IV) n-butoxide, hafnium (IV) tert-butoxide, zirconium (IV) n-propoxide, zirconium (IV) iso-propoxide, zirconium (IV) n-butoxide, zirconium (IV) tert-butoxide, aluminum (III) n-propoxide, aluminum (III) iso-propoxide, aluminum (III) n-butoxide, aluminum (III) tert-butoxide, lanthanum (III) n-propoxide, lanthanum (III) iso-propoxide, lanthanum (III) n-butoxide, lanthanum (III) tert-butoxide, isomers thereof, or any combination thereof.

11. The method of claim 1, wherein the first metal oxide layer comprises titanium oxide and the second metal oxide layer comprises hafnium oxide.

12. The method of claim 1, wherein the first metal oxide layer comprises a first metal and the second metal oxide layer comprises a second metal, and wherein the laminate film has an atomic ratio of the first metal to the second metal of about 5:1 to about 15:1.

13. The method of claim 1, wherein the passivated surface is terminated with one or more alkyl groups.

14. The method of claim 1, wherein at least the first metal alkoxide precursor or the second metal alkoxide precursor is thermally decomposed by p-hydride elimination process.

15. The method of claim 1, wherein at least the first metal alkoxide precursor or the second metal alkoxide precursor is thermally decomposed while in the absence of a co-reactant.

16. A method of forming a metal oxide material, comprising:
positioning a substrate within a processing chamber, wherein the substrate comprises a passivated surface and a non-passivated surface, and wherein the non-passivated surface is terminated with hydride groups, hydroxide groups, or a combination thereof; and
depositing a laminate film selectively on the non-passivated surface while the passivated surface remains at least substantially free of the laminate film, wherein:
the laminate film comprises two or more pairs of alternating layers of a first metal oxide layer and a second metal oxide layer,
a first metal alkoxide precursor is thermally decomposed to produce the first metal oxide layer during a first pulsed-chemical vapor deposition process,
a second metal alkoxide precursor is thermally decomposed to produce the second metal oxide layer during a second pulsed-chemical vapor deposition process,
the first metal alkoxide precursor and the second metal alkoxide precursor independently comprises a metal selected from the group consisting of titanium, zirconium, hafnium, aluminum, and lanthanum, and
the first metal alkoxide precursor and the second metal alkoxide precursor have different metals.

17. The method of claim 16, wherein the substrate is maintained at a first temperature during the first pulsed-chemical vapor deposition process and at a second temperature during the second pulsed-chemical vapor deposition process, and wherein each of the first temperature and the second temperature is independently at about 150° C. to about 450° C.

18. The method of claim 17, wherein each of the first temperature and the second temperature is independently at about 200° C. to about 350° C.

19. The method of claim 16, wherein each of the first metal oxide layer and the second metal oxide layer independently has a thickness of about 0.1 nm to about 5 nm, and wherein the laminate film comprises about 10 pairs to about 50 pairs of the first and second metal oxide layers.

20. A method of forming a metal oxide material, comprising:
positioning a substrate within a processing chamber, wherein the substrate comprises a passivated surface and a non-passivated surface, and wherein the non-passivated surface is terminated with hydride groups, hydroxide groups, or a combination thereof;
exposing the substrate to a first metal alkoxide precursor to produce a first metal oxide layer on or over the non-passivated surface while the passivated surface remains at least substantially free of the first metal oxide layer, wherein the first metal alkoxide precursor is thermally decomposed to produce the first metal oxide layer while the substrate is maintained at a first temperature of about 150° C. to about 350° C.;
exposing the substrate to a second metal alkoxide precursor to produce a second metal oxide layer on the first metal oxide layer while the passivated surface remains at least substantially free of the second metal oxide layer, wherein the second metal alkoxide precursor is thermally decomposed to produce the second metal oxide layer while the substrate is maintained at a second temperature of about 150° C. to about 350° C.; and
sequentially repeating exposing the substrate to the first metal alkoxide precursor and the second metal alkoxide precursor to produce a laminate film comprising alternating layers of the first and second metal oxide layers, wherein the laminate film is amorphous, and wherein the laminate film comprises about 10 pairs to about 100 pairs of the first and second metal oxide layers,
wherein the first metal oxide layer and the second metal oxide layer independently comprises a metal oxide selected from the group consisting of titanium oxide, zirconium oxide, hafnium oxide, aluminum oxide, lanthanum oxide, and dopants thereof, and wherein the first metal oxide layer and the second metal oxide layer contain different metal oxides.

* * * * *